United States Patent [19]

Edgerton

[11] Patent Number: 4,470,369
[45] Date of Patent: Sep. 11, 1984

[54] APPARATUS FOR UNIFORMLY HEATING A SUBSTRATE

[75] Inventor: Robert F. Edgerton, Pontiac, Mich.

[73] Assignee: Energy Conversion Devices, Inc., Troy, Mich.

[21] Appl. No.: 397,189

[22] Filed: Jul. 12, 1982

[51] Int. Cl.$^3$ .............................................. C23C 13/10
[52] U.S. Cl. .................................. 118/723; 118/725; 118/718; 219/342; 219/352
[58] Field of Search ............... 118/725, 723, 718, 719; 219/354, 388, 351, 352, 357, 342; 427/255.5; 432/8; 34/41

[56] References Cited

U.S. PATENT DOCUMENTS

| | | | |
|---|---|---|---|
| 3,180,973 | 4/1965 | Wanielista et al. | 219/348 X |
| 3,275,799 | 9/1966 | Meltzer | 219/348 X |
| 3,471,682 | 10/1969 | Hisey et al. | 219/354 X |
| 3,956,612 | 5/1976 | Ballard et al. | 219/354 X |
| 4,369,730 | 1/1983 | Izu et al. | 118/723 |

OTHER PUBLICATIONS

"Radiant Heat Applications Unlimited", Fostoria Corporation, Fostoria, Ohio, Apr. 1961, p. 17.

Primary Examiner—John D. Smith
Assistant Examiner—Bernard F. Plantz
Attorney, Agent, or Firm—Marvin S. Siskind; Ronald W. Citkowski

[57] ABSTRACT

Apparatus for developing a substantially uniform temperature distribution across the entire transverse width of a relatively thin, relatively large area substrate onto which a plurality of amorphous semiconductor layers will be deposited in a glow discharge deposition chamber. The apparatus includes a plurality of spaced heating elements, the filaments of which are suspended above and angled relative to the plane of the substrate so as to direct radiation onto that portion of the substrate which loses heat at the greatest rate with at least the same intensity as, and preferably greater intensity than, radiation is directed onto those portions of the substrate which lose heat at lesser rates. By establishing the greatest intensity of radiation adjacent that portion of the substrate which most readily loses heat, a uniform distribution of temperature across the transverse width of the substrate may be achieved.

3 Claims, 9 Drawing Figures

APPARATUS FOR UNIFORMLY HEATING A SUBSTRATE

FIELD OF THE INVENTION

This invention relates generally to apparatus for producing photovoltaic devices and more particularly to apparatus for providing a uniform temperature distribution across the transverse width of a substrate to produce more efficient large area photovoltaic devices.

BACKGROUND OF THE INVENTION

The present invention relates to apparatus for uniformly heating relatively large area substrates for the glow discharge deposition thereonto of amorphous silicon alloy layers. More particularly, this invention contemplates the use of a plurality of heating elements for uniformly warming the substrate to an optimum deposition temperature. In the preferred embodiment, the heating elements are spacedly supported above the substrate by a generally A-shaped frame so as to extend from both of the lowermost sides to the raised central portion of said frame. In other words, the heating elements are angularly disposed by the frame so as to be at a minimum distance from the substrate adjacent the edges of the substrate and at a maximum distance from the substrate adjacent the center of the substrate. In this configuration, the edges of the substrate receive the most intense radiation from the heating elements which results in a uniform temperature distribution across the transverse width of the substrate. Should the substrate be used in deposition chambers wherein portions of the substrate other than its edges lose heat at the greatest rate, a uniform temperature distribution across the transverse width of the substrate may be obtained by varying any or all of the following parameters: the angle of the heating elements relative to the substrate, the distance which the heating elements overhang the edges of the substrate and/or the height above the substrate to which the heating elements are raised. As a matter of fact the intensity of radiation upon different parts of the substrate can be modified to achieve a variety of different temperature distributions across the transverse width of the substrate.

Recently, considerable efforts have been made to develop processes for depositing amorphous semiconductor alloys, each of which can encompass relatively large areas, and which can be doped to form p-type and n-type materials for the production of p-i-n-type devices which operate in a substantially equivalent manner to those produced by their crystalline counterparts. For many years such work with amorphous silicon or germanium films was substantially unproductive because of the presence therein of microvoids and dangling bonds which produce a high density of localized states of the energy gap. Initially, the reduction of the localized states was accomplished by glow discharge deposition of amorphous silicon films wherein silane ($SiH_4$) gas is passed through a reaction tube where the gas is decomposed by a radio frequency (r.f.) glow discharge and deposited on a substrate at a substrate temperature of about 500–600 degrees K. (227–327 degrees C). The material so deposited on the substrate is an intrinsic amorphous material consisting of silicon and hydrogen. To produce a doped amorphous material, phosphine gas ($PH_3$), for n-type conduction, or diborane ($B_2H_6$) gas, for p-type conduction is premixed with the silane gas and passed through the glow discharge reaction tube under the same operating conditions. The material so deposited includes supposedly substitutional phosphorus or boron dopants and is shown to be extrinsic and of n or p conduction type. The hydrogen in the silane was found to combine, at an optimum temperature, with many of the dangling bonds of the silicon during the glow discharge deposition to reduce the density of the localized states in the energy gap, thereby causing the amorphous material to more nearly approximate the corresponding crystalline material.

It is now possible to prepare greatly improved amorphous silicon alloys, that have significantly reduced concentrations of localized states in the energy gaps thereof, while providing high quality electronic properties by glow discharge. This technique is fully described in U.S. Pat. No. 4,226,898, Amorphous Semiconductors Equivalent to Crystalline Semiconductors, Stanford R. Ovshinsky and Arun Madan which issued Oct. 7, 1980 and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor operates to substantially reduce the density of the localized states therein and facilitates the addition of other alloying materials, such as germanium.

Activated fluorine readily diffuses into, and bonds to, amorphous silicon in a matrix body to substantially decrease the density of localized defect states therein. This is because the small size of the fluorine atoms enables them to be readily introduced into an amorphous silicon matrix. The fluorine bonds to the dangling bonds of the silicon and forms a partially ionic stable bond with flexible bonding angles, which results in a more stable and more efficient compensation or alteration than could be formed by hydrogen, or other compensating or altering agents which were previously employed. Fluorine is considered to be a more efficient compensating or altering element than hydrogen when employed alone or with hydrogen, because of its exceedingly small size, high reactivity, specificity in chemical bonding, and having highest electronegativity.

Compensation may be achieved with fluorine, alone or in combination with hydrogen, upon the addition of such element(s) in very small quantities (e.g., fractions of one atomic percent). However, the amounts of fluorine and hydrogen most desirably used are much greater than such small percentages, permitting the elements to form a silicon-hydrogen-fluorine alloy. Thus, alloying amounts of fluorine and hydrogen may, for example, be used in a range of 0.1 to 5 percent or greater. The alloy thus formed has a lower density of defect states in the energy gap than can be achieved by the mere neutralization of dangling bonds and similar defect states. In particular, it appears that use of larger amounts of fluorine participates substantially in effecting a new structural configuration of an amorphous silicon-containing material and facilitates the addition of other alloying materials, such as germanium. Fluorine, in addition to the aforementioned characteristics, is an organizer of local structure in the silicon-containing alloy through inductive and ionic effects. Fluorine, also influences the bonding of hydrogen by acting to decrease the density of the defect states which hydrogen normally contributes. The ionic role that fluorine plays in such an alloy is an important factor in terms of the nearest neighbor relationships.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is increased without substantially decreasing the short circuit current.

Many publications on crystalline stacked cells following Jackson have been reported and, more recently, several articles dealing with Si—H materials in stacked cells have been published. Marfaing proposed utilizing silane deposited amorphous Si—Ge alloys in stacked cells, but did not report the feasibility of doing so. (Y. Marfaing, Proc. 2nd European) Communities Photovoltaic Solar Energy Conf., Berlin, West Germany, p. 287, (1979).

Hamakawa et al., reported the feasibility of utilizing Si—H in a configuration which will be defined herein as a cascade type multiple cell. The cascade cell is hereinafter referred to as a multiple cell without a separation or insulating layer therebetween. Each of the cells was made of an Si—material of the same band gap in a p-i-n junction configuration. Matching of the short circuit current ($J_{sc}$) was attempted by increasing the thickness of the cells in the serial light path. As expected, the overall device Voc. increased and was proportional to the number of cells.

Due to the beneficial properties attained by the introduction of fluorine, amorphous alloys used to produce cascade type multiple cells now incorporate fluorine to reduce the density of localized states without impairing the electronic properties of the material. Further band gap adjusting element(s), such as germanium and carbon, can be activated and are added in vapor deposition, sputtering or glow discharge processes. The band gap is adjusted as required for specific device applications by introducing the necessary amounts of one or more of the adjusting elements into the deposited alloy cells in at least the photocurrent generation region thereof. Since the band gap adjusting element(s) has been tailored into the cells without adding substantial deleterious states, because of the influence of fluorine, the cell alloy maintains high electronic qualities and photoconductivity when the adjusting element(s) are added to tailor the device wavelength characteristics for a specific photoresponse application. The addition of hydrogen, either with fluorine or after deposition, can further enhance the fluorine compensated or altered alloy. The post deposition incorporation of hydrogen is advantageous when it is desired to utilize the higher deposition substrate temperatures allowed by fluorine.

It is of obvious commercial importance to be able to mass produce photovoltaic devices. Unlike crystalline silicon which is limited to batch processing for the manufacture of solar cells, amorphous silicon alloys can be deposited in multiple layers over relatively large area substrates to form solar cells in a high volume, continuous processing system. Continuous processing systems of this kind are disclosed, for example, in pending patent applications: Ser. No. 151,301, filed May 19, 1980 for A Method of Making P-Doped Silicon Films and Devices Made Therefrom; Ser. No. 244,386, filed Mar. 16, 1981 for Continuous Systems For Depositing Amorphous Semiconductor Material; Ser. No. 240,493, filed Mar. 16, 1981 for Continuous Amorphous Solar Cell Production System; Ser. No. 306,146, filed Sept. 28, 1981 for Multiple Chamber Deposition and Isolation System and Method; and Ser. No. 359,825, filed Mar. 19, 1982 for Method and Apparatus For Continuously Producing Tandem Photovoltaic Cells. As disclosed in these applications, a substrate may be continuously advanced through a succession of deposition chambers, wherein each chamber is dedicated to the deposition of a specific material. In making a solar cell of p-i-n-type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy. The deposition of each amorphous alloy within each of the dedicated chambers requires that the temperature of the substrate be elevated to approximately 250°–300° C. As with all other parameters of the deposition process, the temperature must be maintained close to the desired range across the transverse width of the substrate in order to produce a photovoltaic device of optimum efficiency. Variations in the temperature across the transverse width of the substrate within a deposition chamber can result in warped substrates which in turn can cause variations in quality of the amorphous layers deposited thereupon. Furthermore, the undulations of a warped substrate may cause the alloy layers deposited on the substrate to scrape against a wall of the passageway as it moves through the gas gate separating adjacent deposition chambers. It is therefore important that the temperature distribution along the transverse width of the substrate be maintained as close as possible to the selected uniform elevated temperature level.

Prior art heating elements essentially comprised a plurality of spaced, elongated quartz infrared light bulbs disposed generally horizontally across the entire transverse width of the substrate. This prior art disposition of single bulbs, the filaments of which extended across and was positioned substantially parallel to the transverse width of the substrate, resulted in the intensity of radiation directed from the filaments onto the substrate to be approximately twice as great at the center of the substrate than at the edges thereof. Further, since the substrate commonly rested upon or slidably engaged a supporting surface, the edges thereof acted as heat sinks which drew heat at the greatest rate from the substrate. It should therefore be apparent that the filaments of the heating elements must be disposed so as to direct the greatest degree of intensity of radiation adjacent to the edges of the substrate to compensate for the highest rate of heat loss occurring adjacent those edges.

Based on the foregoing, the apparatus of the present invention contemplates the use of two infrared light bulbs having a filament length of about eight (8) inches to replace each of the individual, horizontally disposed heating elements having a filament length of approximately sixteen (16) inches which were previously employed. The shortened length filaments, like the elongated filaments of the prior art, are adapted to extend substantially across the entire transverse width of the substrate. However, instead of disposing the shortened filaments of the present invention in a plane substantially parallel to the plane of the substrate, said shortened filaments are angularly disposed relative to the plane of the substrate such that the portions of the filaments adjacent the edges of the substrate are closest to the substrate and the portions of the filaments adjacent the center of the substrate are more remote from the substrate. More particularly, it has been determined that (1) disposing the filaments of the heating elements of the present invention at an angle of approximately 20 degrees relative to the plane of the substrate, and (2) having the ends of the filaments of the heating elements substantially overhang the edges of the substrate (by approximately one and one-half (1½) inches), provides a uniform heat distribution across the entire transverse width of the substrate.

These and the many other objects and advantages of the present invention will become clear from the drawings, the detailed description of the invention and the claims which follow.

BRIEF SUMMARY OF THE INVENTION

Disclosed herein is apparatus for uniformly heating a relatively large area, relatively thin substrate disposed within an isolated deposition chamber and adapted for having amorphous semiconductor layers deposited thereonto. The apparatus includes a plurality of spaced heating elements having filaments which are suspended above and angled relative to the plane of the substrate. The filaments of the heating elements are adapted to provide an intensity of radiation sufficient to heat the edges of the substrate to approximately the same temperature as the center of the substrate despite the effects of heat sinking at said edges. The heating elements are preferably elongated infrared bulbs, the filaments of which are held in said spaced, suspended and angled position relative to the plane of the substrate by a generally A-shaped housing.

The heating elements are supported by the A-shaped housing so as to provide the edges of the substrate with a greater intensity of radiation than the center of the substrate. This is accomplished, in the preferred embodiment, by (1) having the filament of each heating element, the length of which is greater than or equal to the distance from the edge to the center of the substrate, extend from a position adjacent the center of the substrate to a position overhanging one edge of the substrate and (2) angling the filament of each spaced heating element relative to the plane of the substrate so as to be at a minimum distance from the substrate adjacent the edges thereof and a maximum distance from the substrate adjacent the center of the substrate. By so positioning the filaments of each heating element relative to the substrate, the intensity of radiation from the filaments impinging upon the substrate can be adjusted to achieve a uniform temperature distribution across the entire transverse width of the substrate.

DETAILED DESCRIPTION OF THE DRAWINGS

I. The Photovoltaic Cell

Figure 1:
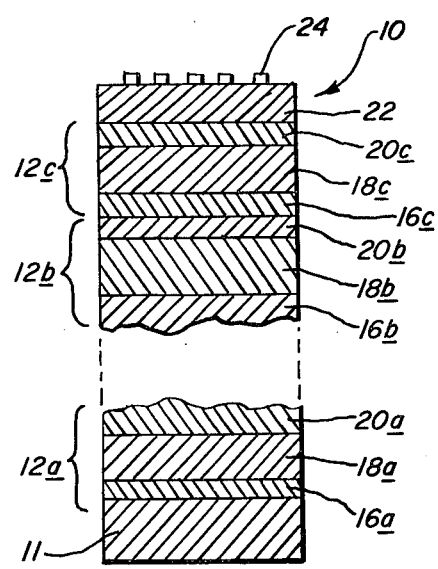
FIG. 1 is a fragmentary, cross-sectional view of a tandem photovoltaic device which can comprise either one or a plurality of p-i-n-type cells, each layer of the cells formed from an amorphous, semiconductor alloy.

Referring now to the drawings and particularly to FIG. 1, a tandem or cascade-type photovoltaic cell, formed of successive p-i-n layers each including an amorphous semiconductor alloy, is shown generally by the numeral 10. It is for the production of this type of photovoltaic device, either wherein (1) amorphous alloy layers are continuously deposited onto a relatively large area, moving web of substrate material in successive isolated deposition chambers or (2) the amorphous alloy layers are successively deposited onto individual, relatively large area substrate sheets, that the uniform heating apparatus of the present invention was developed.

More particularly, FIG. 1 shows a plurality of p-i-n-type photovoltaic devices such as solar cells 12a, 12b and 12c. Below the lowermost cell 12a is a substrate 11 which may be transparent or formed from a metallic surfaced foil. Although certain applications may require a thin oxide layer and/or a series of base contacts prior to application of the amorphous material, for purposes of this application, the term "substrate" shall include not only a flexible film, but also any elements added thereto by preliminary processing. Most commonly the substrate material 11 may be stainless steel, aluminum, tantalum, molybdenum or chrome.

Each of the cells 12a, 12b and 12c are fabricated with an amorphous alloy body containing at least a silicon alloy. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although tandem p-i-n cells are illustrated, the uniform heating apparatus of this invention is equally adapted for use in (1) multiple chamber apparatus which is adapted to produce tandem n-i-p cells or in (2) batch-type production chambers.

For each of the cells 12a, 12b and 12c, the p-type layers are characterized by light absorptive, high conductivity alloy layers. The intrinsic alloy layers are characterized by an adjusted wavelength threshold for solar photoresponse, high light absorption, low dark conductivity and high photoconductivity, including sufficient amounts of a band gap adjusting element or elements to optimize the band gap for the particular cell application. Preferably, the intrinsic layers are band gap adjusted to provide cell 12a with the smallest band gap, cell 12c with the largest band gap, and cell 12b with a band gap between the other two. The n-type layers are characterized by low light absorption, high conductivity alloy layers. The thickness of the n-type layers can be in the range of about 25 to 100 angstroms. The thickness of the band gap adjusted, amorphous intrinsic alloy layers can be between about 2,000 to 3,000 angstroms. The thickness of p-type layers can be between 50 to 200 angstroms. Due to the shorter diffusion length of the holes, the p-type layers generally will be as thin as possible. Further, the outermost layer, here the n-type layer 20c, will be as thin as possible to avoid absorption of light and need not include the band gap adjusting element.

It is to be understood that following the deposition of the semi-conductor alloy layers, a further deposition step may be performed in a separate environment. In this step, a TCO (transparent conductive oxide) layer 22 is added, which layer may, for example, be indium tin oxide (ITO), cadmium stannate ($Cd_2SnO_4$), or doped tin oxide ($SnO_2$). Although an electrode grid 24 may be added to the device, for a tandem cell having a sufficiently small area, the TCO layer 22 is generally sufficiently conductive so the grid 24 is not necessary. If the tandem cell is of a sufficiently large area, or if the conductivity of the TCO layer 22 is insufficient, the grid 24 may be placed on the layer 22 to shorten the carrier path and increase the conduction efficiency thereof.

II. The Multiple Glow Discharge Deposition Chambers

Figure 2:
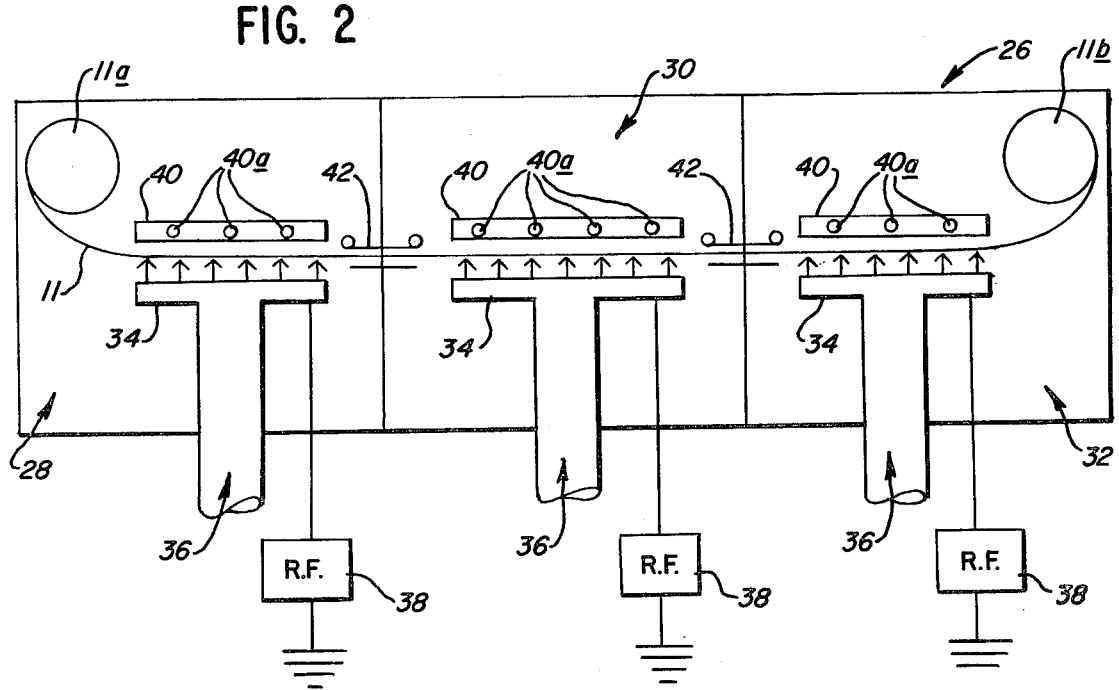
FIG. 2 is a diagrammatic representation of a multiple glow discharge chamber deposition system adapted for the continuous production of the photovoltaic devices shown in FIG. 1.

Turning now to FIG. 2, a diagrammatic representation of a multiple glow discharge chamber deposition apparatus for the continuous production of the tandem photovoltaic cells, previously described, is generally illustrated by the reference numeral 26. The apparatus 26 includes a plurality of isolated, dedicated deposition chambers interconnected by a gas gate 42.

The apparatus 26 is adapted to produce a high volume of large area, amorphous photovoltaic cells having a p-i-n configuration on the deposition surface of a substrate material 11 which is continually fed therethrough. To deposit the amorphous alloy layers required for producing a tandem cell of the p-i-n configuration, the apparatus 26 includes at least on triad of deposition chambers, each triad comprising: a first deposition chamber 28 in which a p-type conductivity amorphous alloy layer is deposited onto the deposition surface of the substrate 11 as the substrate 11 passes therethrough; a second deposition chamber 30 in which an intrinsic amorphous alloy layar is deposited atop the p-type alloy layer on the deposition surface of the substrate 11 as the substrate 11 passes therethrough; and a third deposition chamber 32 in which an n-type conductivity alloy layer is deposited atop the intrinsic layer on the deposition surface of the substrate 11 as the substrate 11 passes therethrough.

It should be apparent that: (1) although one triad of deposition chambers has been described, additional triads or additional individual chambers may be added to the apparatus to provide the apparatus with the capability of producing photovoltaic cells having any number of amorphous layers; (2) the uniform heating machinery of the present invention finds application in any environment wherein amorphous alloy layers are deposited by a glow discharge process onto a substrate; and (3) although in the preferred embodiment, the substrate material is shown and described as a continuous web, the concept of the present invention may be adapted for depositing successive layers atop discrete, relatively large area, relatively thin substrate plates.

Where the apparatus 26 is employed to produce tandem p-i-n or n-i-p-photovoltaic cells, additional triads of deposition chambers are operatively connected to the triad of deposition chambers shown in FIG. 2. In those instances, the apparatus 26 would further include an intermediate chamber (not shown) for isolating the n-type reaction gas mixture flowing through the third deposition chamber 32 and the p-type reaction gas mixture flowing through the first deposition chamber of the succeeding triad.

Each deposition chamber 28, 30 and 32 of the triad is adapted to deposit a single amorphous silicon alloy, by glow discharge deposition onto the substrate 11. To that end, each of the deposition chambers 28, 30 and 32 includes: a cathode 34; a gas supply conduit 36; a radio frequency generator 38; and a plurality of radiant heating elements 40a. It must be noted that all of the operative deposition elements represented in FIG. 2, and most specifically the heating elements 40, are illustrated only schematically. Therefore, FIG. 2 is useful in establishing the environment in which the inventive heating elements of the present invention are to be utilized and in no way is intended to limit or define the actual appearance of those elements.

The supply conduits 36 are operatively associated with the respective cathodes 34 to deliver reaction gas mixtures to the plasma regions created in each deposition chamber 28, 30 and 32 between said cathodes and the substrate 11 traveling therepast. Although the supply core 11a of substrate material 11 is shown rotatably positioned in the first deposition chamber 28 and the take-up core 11b of substrate material is shown rotatably positioned in the third deposition chamber 32, it is to be understood that the supply core 11a and take-up core 11b may be positioned in other chambers operatively connected to the illustrated triad of chambers without departing from the spirit or scope of the present invention.

The radio frequency generators 38 operate in conjunction with the cathodes 34, the radiant heaters 40 and the grounded substrate 11 to form the plasma regions by dissociating the elemental reaction gases entering the deposition chambers 28, 30 and 32 into deposition species. The deposition species are then deposited onto the substrate 11 as amorphous silicon alloy layers.

To form the photovoltaic cell 10 illustrated in FIG. 1, a p-type amorphous silicon layer is deposited onto the substrate 11 in the deposition chamber 28, an intrinsic amorphous silicon alloy layer is deposited atop the p-type layer in the deposition chamber 30 and an n-type amorphous silicon alloy layer is deposited atop the intrinsic layer in the deposition chamber 32. As a result, the apparatus 26, deposits at least three amorphous silicon alloy layers onto the substrate 11 wherein the intrinsic layer deposited in deposition chamber 30 differs in composition from the layers deposited in deposition chambers 28 and 32 by the absence of at least one element which will be referred to as the dopant or doping species. It is important that the alloy layers deposited onto the substrate 11 be of high purity in order to produce high efficiency photovoltaic devices 10. Therefor, the intinsic deposition chamber 30, which has introduced thereinto only intrinsic gases for forming the intrinsic alloy layer, must be isolated from the dopant deposition chambers 28 and 32 wherein the doping species gases are introduced.

Other relevant factors which are important in improving the efficiency of photovoltaic device are: (1) the reduction of warpage of the substrate, and (2) maintaining stable and uniform conditions within the plasma region of the deposition chambers 28, 30 and 32. These factors can be controlled by providing the chambers with apparatus capable of producing a uniform temperature distribution across the entire transverse width of the substrate. This apparatus for achieving more efficient photovoltaic devices will be described in the following section.

III. The Radiant Heating Apparatus

Figure 3A:
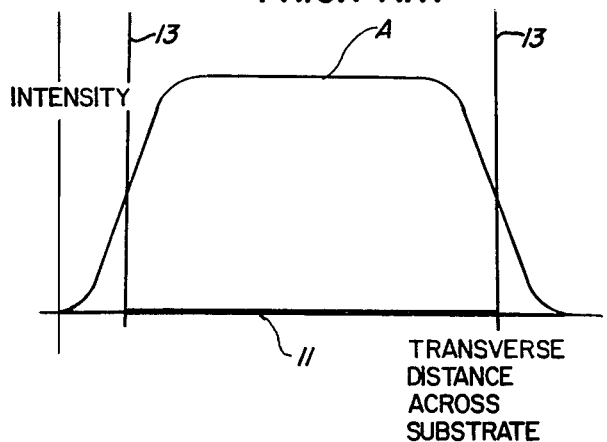
FIG. 3A is a graphic depiction of the intensity of radiation across the transverse width of a substrate as provided by the heating elements of the prior art, the filaments of which are disposed in a plane substantially parallel to the plane of the substrate.
Figure 6:
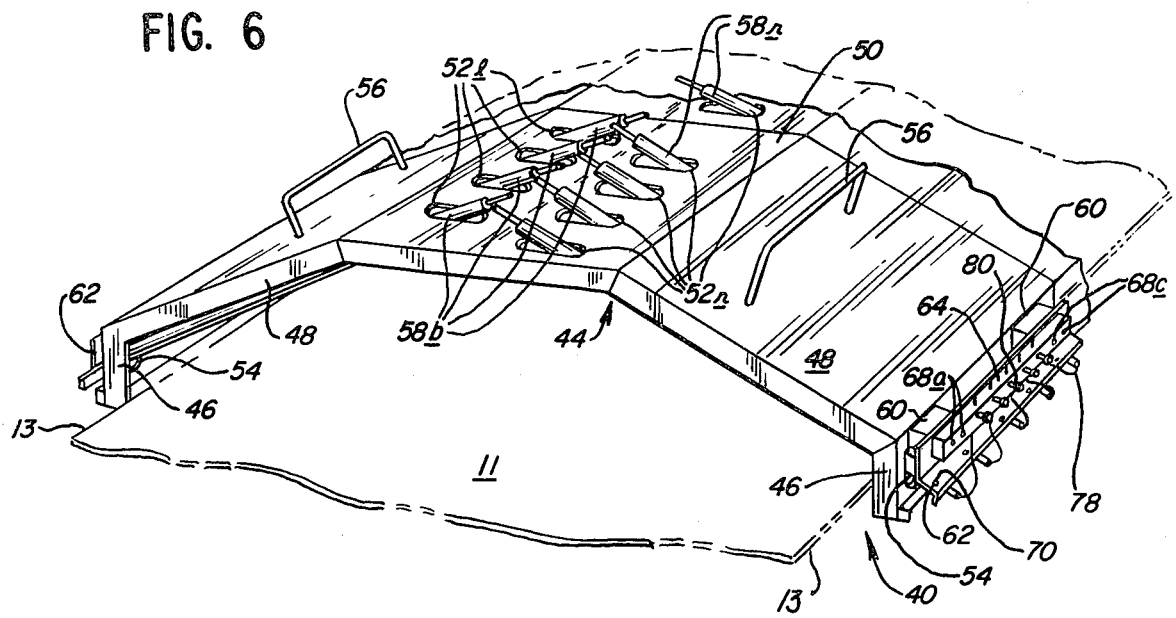
FIG. 6 is a perspective view of the generally A-shaped housing of the present invention, said housing adapted to secure the filaments of the heating elements in an angled position relative to the substrate.
Figure 3B:
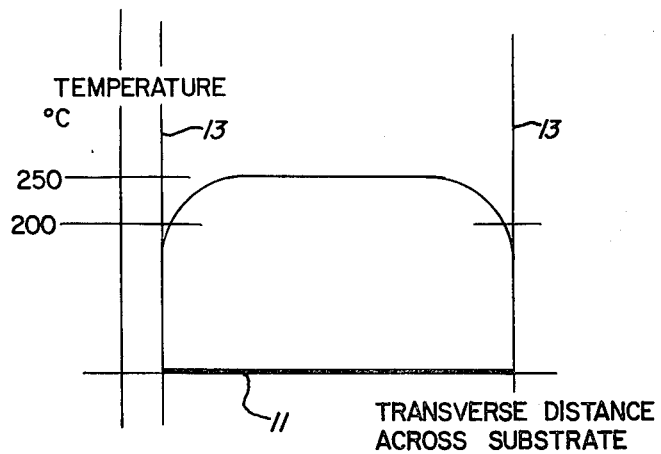
FIG. 3B is a graphic illustration of the temperature distribution across the transverse width of a substrate achieved by the prior art heating elements of FIG. 3A.
Figure 7:
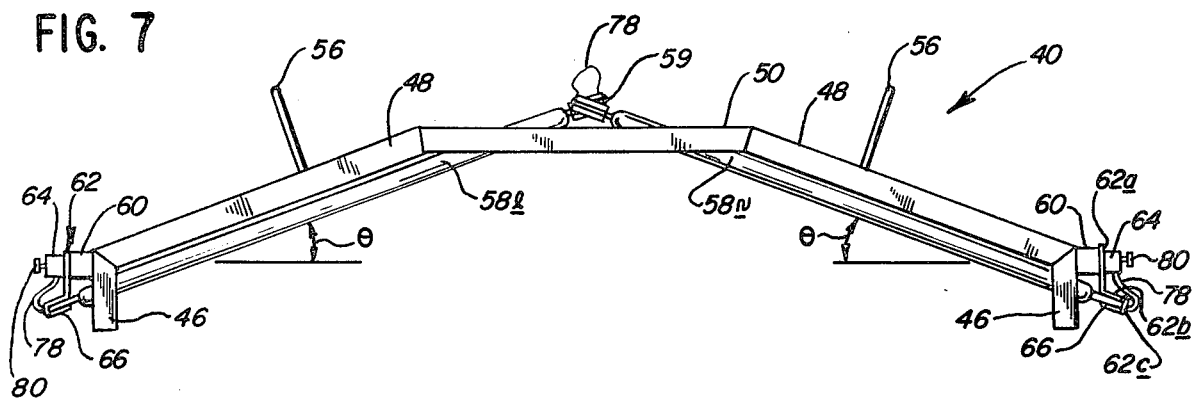
FIG. 7 is an enlarged front elevational view of the generally A-shaped housing of FIG. 6 particularly emphasizing the angle between the plane of the sets of heating elements and the plane of the substrate therebelow.

The apparatus for uniformly heating the substrate, schematically represented in FIG. 2 by the reference numeral 40, is illustrated in detail in FIGS. 6-7. It must be clearly understood that the principle objective of the improved heating apparatus of the present invention is to provide a uniform temperature distribution across, in the preferred embodiment, the relatively large area, relatively thin web of substrate material 11 or, in other preferred embodiments, a relatively large area, relatively thin discrete substrate plate onto which the amorphous alloy layers are to be deposited. Prior art heating apparatus routinely suspended the heating elements 40a, usually in the form of a plurality of approximately sixteen (16) inch long quartz light bulbs, above the approximately sixteen (16) inch wide substrate 11 such that the distal ends of the filament in the bulbs terminated substantially coincidentally with the opposite edges 13 of the substrate 11. The result of that prior art arrangement of heating elements was that the intensity of radiation impinging upon the edges 13 of the substrate 11 was only about one-half the intensity of radiation impinging upon the center portion of the substrate 11 (see FIG. 3A). This represents an obviously undesirable result because it is the edges of the substrate which act as a heat sink and have the greatest heat loss to the support. A curve of intensity of radiation vs. distance across the transverse width of the substrate 11 for the elongated, horizontally disposed heating elements of the prior art is depicted by line A of FIG. 3A. It should be apparent therefrom that the resulting plot (see FIG. 3B) of temperature vs. distance across the transverse width of the substrate reveals that the temperature attains a maximum level adjacent the center of the substrate and assumes a sharply lower level at the opposite edges of the substrate. In practice it has been determined that, when prior heating elements are employed, the temperature at the opposed edges 13 of the substrate routinely varied by as much as 50° C from the temperature adjacent the central portion of the substrate.

Figure 4:
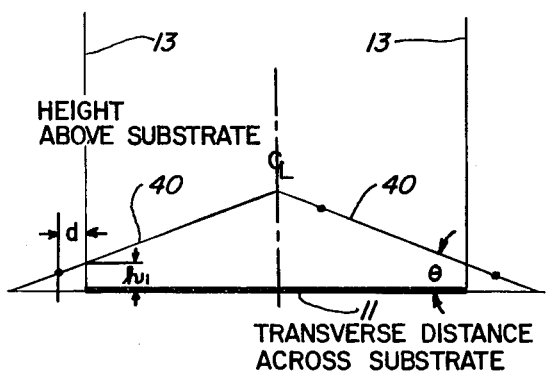
FIG. 4 is a graphic illustration of the angle, relative to the substrate, at which the filaments of the heating elements of the present invention are preferably positioned to provide a uniform temperature distribution across the substrate.

It was to reduce the undesirable variation in temperature across the tranverse width of the web of substrate material 11 that the heating apparatus of the present invention was developed. As illustrated in FIG. 4, which schematically depicts the disposition of the heating elements 40a of the present invention, the filaments of said heating elements 40a may be oriented at: many different heights above the substrate 11; angles relative to the plane of the substrate 11; and distances overhanging the edges of the substrate so as to vary the intensity of radiation impinging upon the substrate. More particularly, (1) the vertical height of the filament of the heating elements 40a above and at the edges of the substrate surface, $h_1$; (2) the angle $\theta$ of the heating elements 40a relative to the plane of the substrate; and (3) the distance, d, representing the horizontal length of the heating elements 40a which overhangs the edges of the substrate, may be varied to achieve a selected intensity of radiation profile for providing a uniform temperature distribution across the transverse width of the substrate.

Turning now to FIGS. 6-7, the apparatus 40 for uniformly heating the substrate will be described in detail. The heating apparatus 40 includes a generally A-shaped housing module 44 which is formed by oppositely disposed, short, generally vertical, apertured panels 46; oppositely disposed, similarly angled, side panels 48; and an apertured generally horizontal top panel 50. The A-shaped housing 44 may be fabricated from stainless steel or other like material which is capable of infrared reflection. The material must also be substantially chemically inert so that the housing modules 40 will not contaminate the deposition chambers in which they are positioned despite elevated temperature and low pressure conditions.

The top panel 50 is a flanged, generally rectangularly shaped, generally planar member. Although illustrated in FIG. 6 as including eight elongated slots (52r and 52l), the number of slots is dependent upon (1) the length of the web of substrate material 11 to be heated, (2) the length of each deposition chamber through which the substrate travels, (3) the temperature to which the substrate must be raised, (4) the heating power of each heating element 58 and (5) the ability to interconnect in modular form with other A-shaped housing modules. The slots (52r and 52l) are aligned in two parallel rows of four equally spaced slots. For reference, the right hand row of slots will be referred to as 52r and the left hand row of slots will be referred to as 52l. The slots in each parallel row may either be offset (or staggered) relative to the slots in the other row or aligned with the slots in the other row. In other words, in the staggered embodiment, each of the left hand side heating elements 58l is disposed in the left hand side slots 52l so as to lie either (1) in a plane parallel to and equally spaced between the plane of the two adjacent right hand side heating elements 58r which are disposed in the right hand side slots 52r, or (2) in the same plane as the adjacent right hand slot 52r.

The angled side panels 48 are flanged, generally rectangularly shaped, planar members. The side panels 48 are either joined to or stamped together with the top panel 50 so as to be angularly disposed relative to the top panel 50. The angle which the side panels 48 form relative to the top panel 50 approximates the angle which it is desired to have the heating elements 58 form relative to the substrate 11. In a like manner, the vertical panels 46 are flanged, generally rectangularly shaped, apertured, planar members either joined to or stamped together with the top panel 50 and the side panels 48 so as to form the unitary, generally A-shaped heating housing or frame module 40. The shape of the apertures 54 through the vertical panels 46 can be circular, slot-shaped or any combination thereof without departing from the spirit or scope of the present invention. It should be apparent, although the left hand vertical panel is not illustrated, that, in the preferred embodiment, the apertures 54 through the left hand vertical panel 46 are staggered relative to the apertures 54 through the right hand vertical panel 46. In the staggered embodiment, the apertures 54 through each of the right and left hand sides of the vertical panel 46 are aligned with the corresponding right or left hand slots 52 through the upper panel 50. More particularly, the right hand apertures 54 in the right hand vertical panel are equal in number to and aligned with the right hand slots 52r in the upper panel 50 and the left hand apertures 54 in the left hand vertical panel are equal in number to and aligned with the left hand slots 52l in the upper panel 50. In another preferred embodiment, the slots may be aligned so that the left and right hand heating elements lie in a single plane across the transverse width of the substrate 11.

Although the total length of the A-shaped housing 40 is dependant upon the length of a deposition chamber in which it is disposed and a plurality of modules may be needed to heat the substrate in an elongated chamber, the width of each A-shaped housing module is preferably greater than the width of the substrate 11 and less than the width of the deposition chamber.

The A-shaped housing 40 is adapted to be secured within a deposition chamber such as 28, 30 or 32 in any conventional manner as by clamping. It may, however, even be suspended above the substrate 11 by carrying handles 56 extending from each of the side panels 48, although those handles are primarily intended for manual manipulation of the modules.

Each of the plurality of heating elements are preferably commercially available quartz, infared 120-volt bulbs having approximately an eight (8) inch long filament and a total length of approximately eleven and thirteen-sixteenth (11-13/16) inches. The heating elements 58r and 58l are supported by the housing 40 so as to extend from one of the apertures 54 in one of the vertical panels 46 through the corresponding slot 52 in the top panel 50. More particularly, in the preferred embodiment of the invention, each light bulb 58r and 58l extends through one of the apertures 54 in, for example, the right hand vertical panel 46 and through a corresponding one of the right hand slots 52r in the top panel 50. In this manner the light bulbs 58r and 58l are disposed in a plurality of parallel planes, with the right and left hand rows (1) stagerred relative to one another, and (2) angled (at about twenty degrees) relative to the substrate 11 therebelow. Furthermore, one end of the filament in each of the light bulbs 58r and 58l overlaps one of the edges 13 of the substrate 11 (by approximately one to two inches) while the other end of each of the bulbs extends through the corresponding upper plate slots 52 adjacent to, but short of, the center of the substrate 11.

Figure 5A:
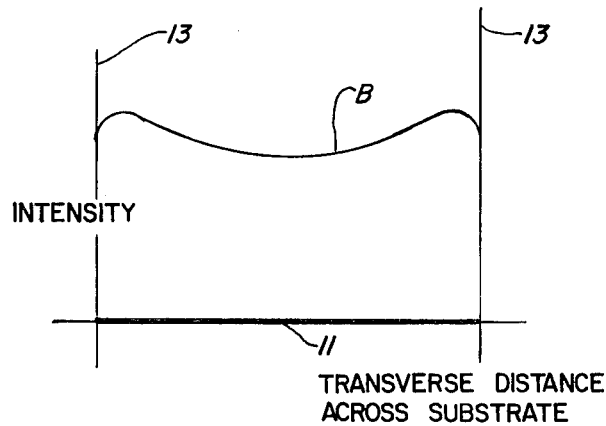
FIG. 5A is a graphic depiction of the intensity of radiation across the transverse width of a substrate as provided by the angularly disposed filaments of the heating elements shown in FIG. 4.
Figure 5B:
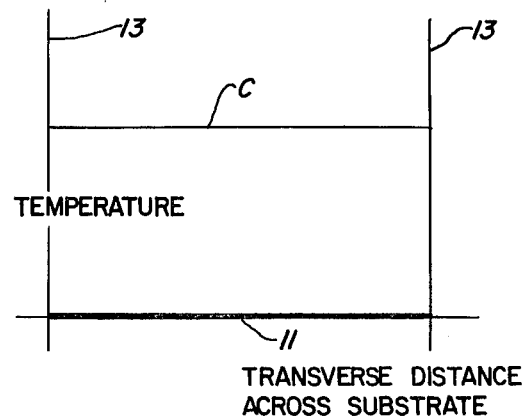
FIG. 5B is a graphic illustration of the temperature distribution across the transverse width of a substrate achieved by the angularly disposed filaments of the heating elements shown in FIG. 4 and providing the intensity of radiation plotted in FIG. 5A.

With the foregoing disposition and angulation of the filaments of the heating elements relative to the substrate 11, a plot of intensity of radiation vs. the transverse distance across the substrate results in the graph of FIG. 5A wherein line B clearly indicates that the heating elements direct a maximum intensity of radiation onto the substrate near or at the edges 13 thereof, as per design criteria, and a minimum intensity of radiation onto the substrate at the central portion thereof. FIG. 5B is a graph of temperature of the substrate 11 vs. the transverse distance across the substrate, and as is clear from that graph (see line C), a substantially uniform temperature distribution across the substrate has been achieved. As should be apparent by now, the uniform temperature is due to the fact that the intensity of radiation is greatest adjacent the edges 13 of the substrate 11 to compensate for the fact that the greatest loss of heat occurs at the edges thereof.

As best seen in FIGS. 6-14 7, the apparatus for electrically connecting and physically supporting the heating elements 58 includes a pair of lamp standoff blocks 60; a heating element support 62; a bus bar 64; and a clamp 66. It should be apparent that the illustrated apparatus is solely for purposes of disclosure and may be modified without departing from the essence of the instant invention. Each of the lamp standoff blocks 60 is a short, rectangularly shaped element which includes a plurality of threaded bores formed therethrough. Two of the threaded bores are aligned with a pair of holes formed in opposed upper corners of each vertical panel 46 of the A-shaped housing 40 for securing the blocks 60 thereto. Other bores in the blocks 60 are aligned with (1) a pair of holes formed in opposed portions of the heating element support 62 and (2) a pair of holes 68a formed in opposed portions of the bus bar 64. In this manner, a plurality or screws are adapted to secure the support 62 and the bus bar 64 to the vertical wall 46 of the A-shaped housing 40.

Both infrared heating element supports 62 are integrally formed members which include a generally planar securement plate 62a, a generally planar, angulated plate 62b and a generally planar end plate 62c. The angulated plate 62b of the support 62 includes a plurality of threaded apertures 70 for screwably receiving therein screws which are adapted to secure heating element clamps 66 to the support 62. The number of apertures 70 in the right and left hand angulated plates 62b of the supports 62 is equal to the number of heating elements 58r or 58l on the right hand side or the left hand side, respectively, of the A-shaped housing module 40.

Positioned intermediate of the opposed holes 68a in the bus bar 64 are a plurality of interconnected sets of throughbores and perpendicular threaded apertures. As best illustrated in FIG. 6, electrical wires 78 extend from the ends of each of the heating elements 58r through the bottom opening in each of the bores. The wires 78 are secured by a plurality of screws 80, threaded into the apertures so as to clamp the wires 78 against the internal wall of said bores. The wires 78 are preferably fabricated from nickel because it is a substantially unreactive metal and will not contaminate the deposition chambers at high temperature and low pressure.

The lowermost and the uppermost ends of the heating elements are crimped so as to form an air-tight seal for preventing the energized bulbs from contaminating the deposition chambers 28, 30 and 32. An electrically conductive sleeve 59 (see FIG. 7), of a substantially chemically inert material, is fashioned about both the crimped ends of each of the heating elements 58r and 58l for connecting the electrical wires 78 to the filaments within the heating elements. The crimped uppermost ends of each one of the right hand side and left hand side heating elements are interconnected by the wire 78 to form a series connection. By extending one lead from a power source (not shown) to the right hand side bus bar 64 and another lead from the left hand side bus bar to the power source, the heating elements 58 are adapted to be energized. It should be apparent that the clamp 66 secures the crimped sleeve of each heating element 58 to the support 62 which is, in turn, secured to the vertical panel 46 of the A-shaped housing 40. In this manner the heating elements 58 can be maintained at the preselected angle $\theta$ relative to the substrate 11 for achieving the necessary intensity of radiation across the substrate.

In the preferred embodiment, it has been found that if: (1) the angle $\theta$ for both the right hand side heating elements 58r and the left hand side heating elements 58l is approximatelly 20°; (2) the distance "d" which the filament in each of the heating elements 58 overhangs the edge 13 of the substrate 11 is approximately one (1) to two (2) inches; (3) the height "$h_1$" which the filaments of each of the heating elements 58 rise above the lateral edges 13 of the substrate 11 is approximately one and one-half ($1\frac{1}{2}$) to three (3) inches; and (4) 120-volt, eight (8) inch long heating elements are used; the substrate 11 will achieve a substantially uniform temperature distribution across the transverse width thereof of approximately 250° C.

It should be understood that the present invention is not limited to the precise structure of the illustrated embodiments. It is intended that the foregoing description of the presently preferred embodiments be regarded as an illustration rather than as a limitation of the present invention. It is the following claims, including all equivalents, which are intended to define the scope of this invention.

I claim:

1. Apparatus for uniformly heating a relatively large area, relatively thin substrate within a low pressure, elevated temperature deposition chamber wherein a semiconductor layer is deposited onto said substrate: said apparatus including, in combination:

a glow discharge deposition chamber; means for moving said substrate through said chamber;

a plurality of spaced, generally linear, elongated, radiant heating elements spaced from and angled relative to the plane of the substrate within the deposition chamber; and, means associated with each of said heating elements for adjusting (1) the distance between a first end of each heating element and the substrate relative to the distance between a second end of said element and the substrate, and (2) the proximity, in the transverse direction relative to the plane of the substrate, of the adjacent one of the ends of the heating elements from the edge portions of the substrate, so as to direct the greatest intensity of radiation onto the edges portions of the substrate, since said edge portions of the substrate lose heat at the greatest rate; and housing means for holding each heating element in an angled condition relative to the substrate so that each heating element is disposed at a minimum distance from the substrate adjacent the edge portions of the substrate and at maximum distance from the substrate adjacent the center of the substrate, whereby, a substantially uniform temperature distribution across the transverse width of the substrate is established.

2. Apparatus as in claim 1, wherein the length of each heating element is greater than or equal to the distance from the edge to the center of the substrate; and the housing is adapted to support a first set of said spaced heating elements so as to extend from a position adjacent the center of the substrate to a position overhanging a first edge of the substrate, and the housing is adapted to support a second set of said spaced heating elements so as to extend from a position adjacent the center of the substrate to a position overhanging an edge of the substrate opposite the first edge.

3. Apparatus as in claim 2, wherein (1) the plane of each heating element of each set of spaced heating elements is substantially parallel to the plane of every other heating element of each set, and (2) each of said heating elements is supported at an angle of approximately 20 degrees relative to the plane of the substrate.

* * * * *